United States Patent
Wu et al.

(10) Patent No.: US 9,252,054 B2
(45) Date of Patent: Feb. 2, 2016

(54) THINNED INTEGRATED CIRCUIT DEVICE AND MANUFACTURING PROCESS FOR THE SAME

(71) Applicant: INDUSTRIAL TECHNOLOGY RESEARCH INSTITUTE, Hsinchu (TW)

(72) Inventors: Sheng-Tsai Wu, Bade (TW); Heng-Chieh Chien, New Taipei (TW); John H. Lau, Taipei (TW); Yu-Lin Chao, Hsinchu (TW); Wei-Chung Lo, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/484,970

(22) Filed: Sep. 12, 2014

(65) Prior Publication Data

US 2015/0076682 A1    Mar. 19, 2015

Related U.S. Application Data

(60) Provisional application No. 61/877,775, filed on Sep. 13, 2013.

(30) Foreign Application Priority Data

Jan. 10, 2014 (TW) .............................. 103101039 A

(51) Int. Cl.
*H01L 23/367* (2006.01)
*H01L 21/768* (2006.01)
(Continued)

(52) U.S. Cl.
CPC ...... *H01L 21/76898* (2013.01); *H01L 21/4882* (2013.01); *H01L 21/50* (2013.01);
(Continued)

(58) Field of Classification Search
CPC ....... H01L 23/481; H01L 24/81; H01L 24/13; H01L 24/17; H01L 24/03; H01L 21/768
See application file for complete search history.

(56) References Cited

U.S. PATENT DOCUMENTS 7,038,316 B2    5/2006    Hu et al.
8,063,482 B2    11/2011   Lu
(Continued)

FOREIGN PATENT DOCUMENTS

TW    201209980 A    3/2012
TW    201230258 A    7/2012

OTHER PUBLICATIONS

Martin Zimmermann et al., A Seamless Ultra-Thin Chip Fabrication and Assembly Process, Institute for Microelectronics Stuttgart (IMS CHIPS), Electron Devices Meeting, 2006.
(Continued)

*Primary Examiner* — Roy Potter
(74) *Attorney, Agent, or Firm* — Tim Tingkang Xia; Locke Lord LLP

(57) ABSTRACT

A thinned integrated circuit device and manufacturing process for the same are disclosed. The manufacturing process includes forming a through-silicon via (TSV) on a substrate, a first terminal of the TSV is exposed on a first surface of the substrate, disposing a bump on the first surface of the substrate to make the bump electrically connected with the TSV, disposing an integrated circuit chip (IC) on the bump so that a first side of the IC is connected to the bump, disposing a thermal interface material (TIM) layer on a second side of the IC opposite to the first side of the IC, attaching a heat-spreader cap on the IC by the TIM layer, and backgrinding a second surface of the substrate to expose the TSV to the second surface of the substrate while carrying the heat-spreader cap.

18 Claims, 9 Drawing Sheets

(51) Int. Cl.
  *H01L 21/48* (2006.01)
  *H01L 23/42* (2006.01)
  *H01L 23/427* (2006.01)
  *H01L 23/433* (2006.01)
  *H01L 21/50* (2006.01)
  *H01L 21/56* (2006.01)
  *H01L 25/065* (2006.01)
  *H01L 23/00* (2006.01)
  *H01L 23/498* (2006.01)
  *H01L 25/18* (2006.01)

(52) U.S. Cl.
  CPC ......... *H01L 21/563* (2013.01); *H01L 23/3675* (2013.01); *H01L 23/42* (2013.01); *H01L 23/4275* (2013.01); *H01L 23/433* (2013.01); *H01L 24/29* (2013.01); *H01L 24/97* (2013.01); *H01L 25/0652* (2013.01); *H01L 25/0655* (2013.01); *H01L 23/49816* (2013.01); *H01L 23/49827* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 25/18* (2013.01); *H01L 2224/16235* (2013.01); *H01L 2224/2929* (2013.01); *H01L 2224/29387* (2013.01); *H01L 2224/32225* (2013.01); *H01L 2224/32245* (2013.01); *H01L 2224/73204* (2013.01); *H01L 2224/73253* (2013.01); *H01L 2224/81005* (2013.01); *H01L 2224/81192* (2013.01); *H01L 2224/83005* (2013.01); *H01L 2224/83191* (2013.01); *H01L 2224/92125* (2013.01); *H01L 2224/92225* (2013.01); *H01L 2224/97* (2013.01); *H01L 2924/12042* (2013.01); *H01L 2924/157* (2013.01); *H01L 2924/15311* (2013.01); *H01L 2924/167* (2013.01); *H01L 2924/1659* (2013.01); *H01L 2924/16153* (2013.01); *H01L 2924/16251* (2013.01); *H01L 2924/16724* (2013.01); *H01L 2924/16747* (2013.01)

(56) References Cited

U.S. PATENT DOCUMENTS

| | | | |
|---|---|---|---|
| 8,143,097 | B2 | 3/2012 | Chi et al. |
| 8,421,212 | B2 | 4/2013 | Chen et al. |
| 8,526,186 | B2 | 9/2013 | Yokoya et al. |
| 2009/0294938 | A1* | 12/2009 | Chen .............. 257/676 |
| 2010/0213600 | A1 | 8/2010 | Lau et al. |
| 2011/0272824 | A1 | 11/2011 | Pagaila |
| 2013/0075937 | A1 | 3/2013 | Wang et al. |
| 2013/0122689 | A1 | 5/2013 | Wang et al. |
| 2013/0134559 | A1 | 5/2013 | Lin et al. |
| 2013/0217188 | A1 | 8/2013 | Wang et al. |

OTHER PUBLICATIONS

C. Landesberger et al., Carrier techniques for thin wafer processing, CS Mantech Conference, 2007, p. 33-36, Austin, Texas, USA.

Florian Bieck et al., Carrierless Design for Handling and Processing of Ultrathin Wafers, Electronic Components and Technology Conference, 2010, p. 316-322.

Zhicheng LV et al., Carrierless thin wafer handling for 3D integration, International Conference on Electronic Packaging Technology & High Density Packaging, 2012, p. 922-925.

K. Zoschke et al., Evaluation of Thin Wafer Processing using a Temporary Wafer Handling System as Key Technology for 3D System Integration, Electronic Components and Technology Conference, 2010, p. 1385-1392.

* cited by examiner

THINNED INTEGRATED CIRCUIT DEVICE AND MANUFACTURING PROCESS FOR THE SAME

CROSS-REFERENCE TO RELATED APPLICATIONS

This non-provisional application claims priority under 35 U.S.C. §119(a) on Patent Application No. 103101039 filed in Taiwan, R.O.C. on Jan. 10, 2014 and priority under 35 U.S.C. §119(e) on U.S. Provisional Application No. 61/877,775 filed on Sep. 13, 2013, the entire contents of which are hereby incorporated by reference.

TECHNICAL FIELD

The disclosure relates a thinned integrated circuit device and a manufacturing process for the same.

BACKGROUND

Integrated circuit (IC) is one of the most common components for electric products in our daily lives. To increase the number of the logic gates or circuits in a unit area/volume is a consistent goal for IC engineers. 3D IC integration has many advantages compared to normal encapsulation process, such as smaller component size, less signal loss, and better electrical performance.

Wafer thinning is one of the key techniques to develop 3D IC integration, and the wafer can be thinned under 100 micrometers by current technology. Generally, the manufacturing process is exposing the through-silicon via (TSV) of the thinned wafer and executing the following processes, such as circuit redistribution on the back, removing the bond (stripping) of the carrier, and finishing the fabrication of the medium layer. However, the disadvantage of the current method for wafer thinning is that it is easy to damage the carrier when removing the bond and the step of thinning is very complex. Therefore, the current yield rate of wafer thinning is not ideal and the cost is amazing.

SUMMARY

A thinned integrated circuit device provided by an embodiment of the disclosure comprises a first substrate, at least one through-silicon via (TSV), at least one first bump, a first integrated circuit (IC), a thermal interface material (TIM), and a first heat-spreader cap. The first substrate has a first surface and a second surface opposite to the first surface. The TSV penetrates through the first substrate from the first surface to the second surface, wherein a first terminal of the TSV is on the first surface and a second terminal of the TSV is on the second surface. The first bump is disposed on the first surface and electrically connected with the first terminal of the TSV. The first IC has a first side and a second side, wherein the first side is connected with the first bump. The TIM layer is at least disposed on the second side of the first IC. The first heat-spreader cap is used as a carrier and attached on the first IC by the TIM layer for cooling the first IC.

A manufacturing process of the thinned integrated circuit device provided by an embodiment of the disclosure comprises forming at least one TSV on the first substrate, a first terminal of the TSV exposed to a first surface of the first substrate. Then at least one first bump is disposed on the first surface of the first substrate to make the first bump be electrically connected with the TSV. A first IC is disposed on the first bump and the first IC has a first side and a second side, and the first side of the first IC is connected with the first bump. A TIM layer is disposed on the second side of the first IC. A lower surface of a first heat-spreader cap is attached on the first IC by the TIM layer, wherein the shape and size of the first heat-spreader cap is the same with the first substrate. The heat-spreader cap is used as a carrier and the first IC is fixed by fixing the first heat-spreader cap to backgrind a second surface opposite to the first surface of the first substrate to expose a second terminal of the TSV to the second surface.

The contents of the invention set forth and the embodiments hereinafter are for demonstrating and illustrating the spirit and principles of the invention, and for providing further explanation of the claims.

BRIEF DESCRIPTION OF THE DRAWINGS

The present invention will become more fully understood from the detailed description given hereinbelow and the accompanying drawings, which are given by way of illustration only and thus are not limitative of the invention and wherein.

DETAILED DESCRIPTION OF DISCLOSED EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
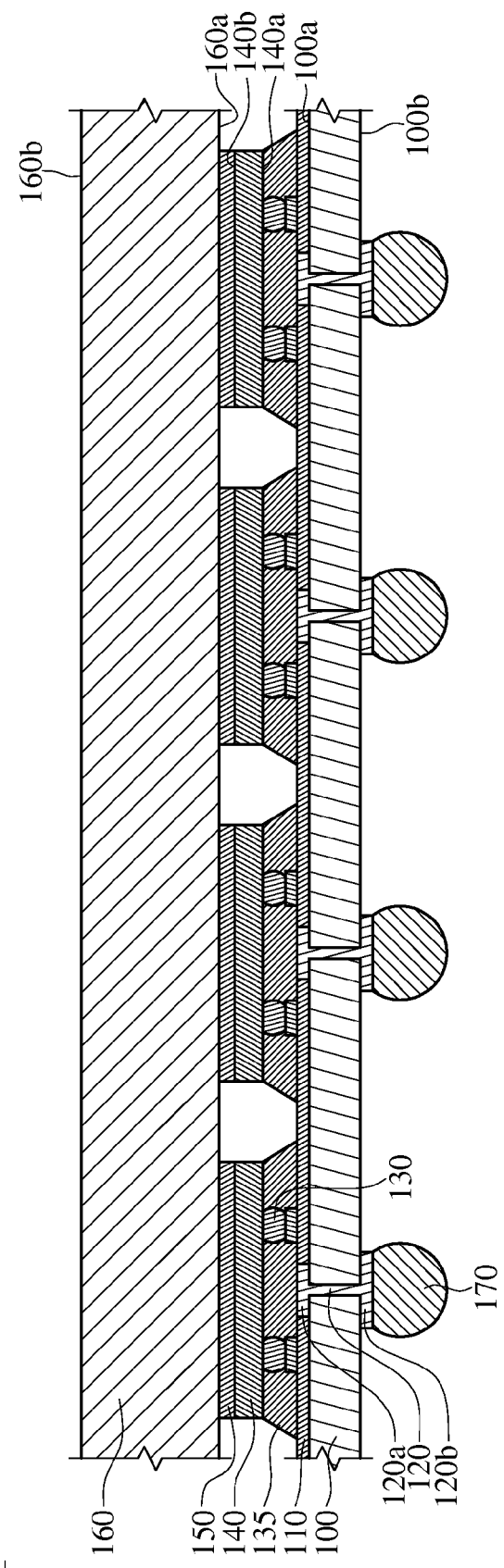
FIG. 1 is a partial cross-sectional diagram of the thinned integrated circuit device according to an embodiment of the disclosure.

Please refer to FIG. 1. FIG. 1 is a partial cross-sectional diagram of the thinned integrated circuit device according to an embodiment of the disclosure. As shown in FIG. 1, the thinned integrated circuit device 10 comprises a first substrate 100, a passivation layer 110, at least one through-silicon via (TSV) 120, at least one first bump 130, an underfill 135, a first integrated circuit (IC) 140, a thermal interface material (TIM) layer 150, a first heat-spreader cap/first heat-spreader board 160, and a second bump 170. The usage of the first heat-spreader cap or the first heat-spreader board depends on the realistic situation. Taking the first heat-spreader cap for example, the first substrate 100 has a first surface 100a and a second surface 100b opposite to the first surface 100a. The TSV 120 penetrates through the first substrate 100 from the first surface 100a to the second surface 100b, and the first terminal 120a of the TSV 120 is on the first surface 100a, and the second terminal 120b of the TSV 120 is on the second surface 100b. The first bump 130 is disposed on the first surface 100a and electrically connected with the first terminal 120a of the TSV 120. The first IC 140 has a first side 140a and a second side 140b, and the first IC 140 uses the first side 140a to connect with the first bump 130. The underfill 135 is disposed between the first substrate 100 and the first IC 140 for fixing the first IC 140 and the first bump 130. The TIM layer 150 is at least disposed on the second side 140b of the first IC 140. The first heat-spreader cap 160 is attached on the first IC 140 by the TIM layer 150 and the first heat-spreader cap 160 is for cooling the first IC 140. The first heat-spreader cap 160 has a lower surface 160a connected with the TIM layer 150 and a opposite upper surface 160b. The roughness of the upper surface 160b can be less than a threshold for fitting with an encapsulation cap or a set of heat-spreader fins. The second bump 170 can be disposed on the second surface 100b and electrically connected with the TSV 120. The passivation layer 110 is disposed on the first surface 100a of the first substrate 100.

Figure 2A:
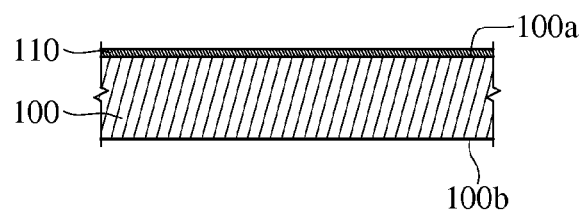
FIG. 2A to 2H are diagrams of the steps in the manufacturing process of the thinned integrated circuit device according to an embodiment of the disclosure.

According to an embodiment of the disclosure, in association with the manufacturing process of the thinned integrated circuit device 10, please refer to FIG. 2A to FIG. 2H. FIG. 2A to 2H are diagrams of the steps in the manufacturing process of the thinned integrated circuit device according to an embodiment of the disclosure. As shown in FIG. 2A, a first substrate 100 is provided and a metal layer is implanted on the first surface 100a of the first substrate 100 and then passivated to form a passivation layer 110. The passivation layer 110 is for rearranging the electrically connection relationships in the following procedures. The method for passivating the metal layer to form the passivation layer 110 can be passivating the metal layer using chemicals or connecting the metal layer to an electrode for oxidization by applying the principles of electrochemistry.

Figure 2B:
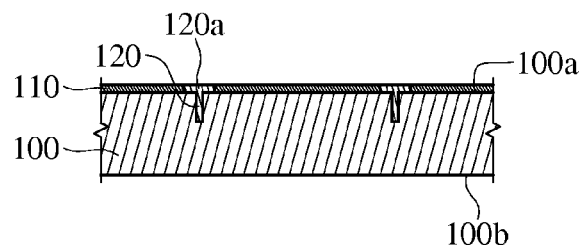

As shown in FIG. 2B, at least one TSV 120 is formed on the first substrate 100 and the first terminal 120a of the TSV 120 is exposed to the first surface 100a of the first substrate 100. The method to form the TSV 120 can be perforation by mechanics, chemistry, or laser to form a groove on the first surface 100a of the first substrate 100 and penetrating through the passivation layer 110, and then use conductive materials such as copper, polysilicon, or wolfram to fill the groove to form the TSV 120. In this stage, the TSV 120 may not need to penetrate the first substrate 100.

Figure 2C:
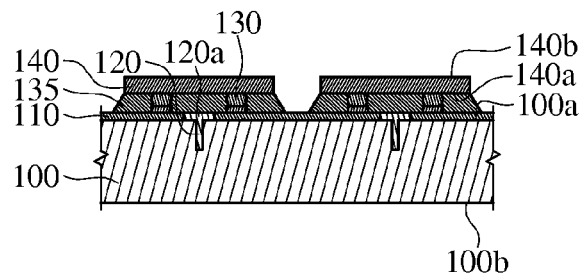

As further shown in FIG. 2C, at least one first bump 130 is disposed on the first surface 100a of the first substrate 100 to make the first bump 130 be electrically connected with the TSV 120. Then a first IC 140 is disposed on the first bump 130, and the first IC 140 has a first side 140a and a second side 140b, and the first side 140a of the first IC 140 is connected with the first bump 130. In this step, first, the passivation layer 110 is redistributed according to the circuit layout by exposure development to define new wire patterns on the passivation layer 110, and then electroplating and/or etching techniques are used to manufacture new metal wires to connect the first terminal 120a of the TSV 120 and the location of disposing the first bump 130, so that the purpose of wire redistribution is achieved. After the location of the first IC 140 is fixed on the first surface 110a of the first substrate 100, a first bump 130 is disposed for electrically connecting the internal circuit of the first IC 140 with the TSV 120 through the first bump 130. After the first bump 130 is disposed, the underfill 135 is filled between the first IC 140 and the first substrate 100 to further fix the first IC 140.

Figure 2D:
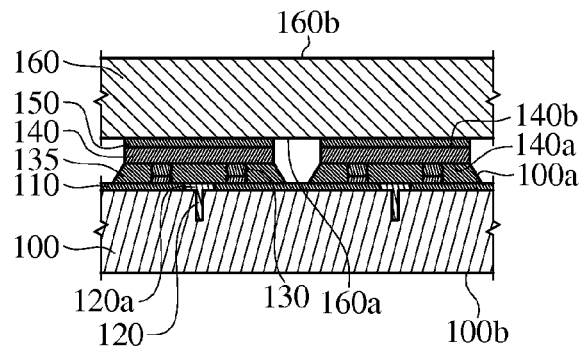

As shown in FIG. 2D, the TIM layer 150 is disposed on the second side 140b of the first IC 140. The lower surface 160a of the first heat-spreader cap 160 is attached on the first IC 140 by the TIM layer 150. The material of the TIM layer 150 includes but not limited to ceramic, beryllium oxide, aluminum nitride, zinc oxide, SiO2, phase change metal alloy (PCMA), or other materials with high thermal conductivity. The said material is made into a colloid to form a thermal conductive glue or a thermal conductive medium, and is painted on the second side 140b of the first IC 140 to form a TIM layer 150, and then the first heat-spreader cap 160 is attached on the TIM layer 150. Therefore, the first heat-spreader cap 160 is attached on the second side 140b of the first IC 140 by the TIM layer 150.

Figure 2E:
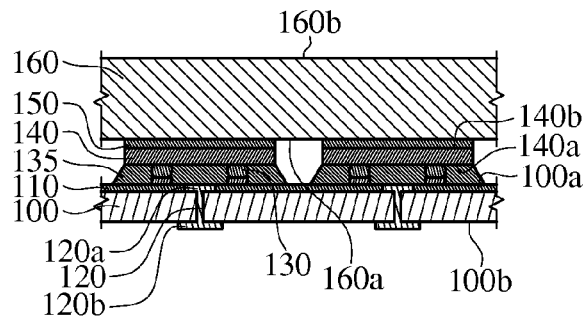

As shown in FIG. 2E, the first heat-spreader cap 160 is used as a carrier, and the whole wafer can be fixed by fixing the first heat-spreader cap 160 to backgrind (or polish etc.) the second surface 100b opposite to the first surface 100a of the first substrate 100, until the second terminal 120b of the TSV 120 is exposed to the second surface 100b. After the TIM layer 150 is solidified, the first heat-spreader cap 160 is used as a carrying device, and the first heat-spreader cap 160 is fixed, and the backgrinding process is started to execute on the second surface 100b of the first substrate 100. The backgrinding process can be executed until the second terminal 120b of the TSV 120 is exposed to the second surface 100b, or after the second terminal 120b of the TSV 120 is exposed to the second surface 100b, the backgrinding process can be further executed until the first thickness (the distance between the first surface 100a and the second surface 100b) of the first substrate 100 is equal to a default thickness. The manufacturing process according to an embodiment of the disclosure can be the whole description above, and the completed thinned integrated circuit device including the IC 140 can be further encapsulated and tested. The size and shape of the first heat-spreader cap 160 is equal to or similar to the first substrate 100, and the available material for the first heat-spreader cap 160 may be used high thermal conductivity, low thermal expansion coefficient, and enough strength for supporting the whole structure to finish the following manufacturing process (such as wafer backgrinding, process for circuit layer and insulation layer).

In an embodiment of the disclosure, the first substrate 100 can be a wafer or other semiconductor material, such as 8-inch silicon wafer or 12-inch silicon wafer. A plurality of first ICs 140 can be disposed on the first surface 100a of the first substrate 100, and the first heat-spreader cap 160 can be selected by the size and shape equal to (or similar to) the first substrate 100. The first heat-spreader cap 160 is attached on the second side 140b of the plurality of the first IC 140 by the TIM layer 150. Then the first heat-spreader cap 160 is used as a carrier, and the first heat-spreader cap 160 is fixed on the second side 140b of the plurality of the first IC 140, and the process of backgrinding the second surface 100b of the first substrate 100 is executed. Because of the shape and size of the first heat-spreader cap 160, the stress produced from backgrinding is uniformly distributed on the TIM layer 150 between the plurality of the first IC 140 and the first heat-spreader cap 160, and on the underfill 135 between the plurality of the first IC 140 and the first substrate 100, to reduce the probability of damaging the first IC 140 and the corresponding circuit by the stress produced from backgrinding and enhance the yield rate.

Figure 2F:
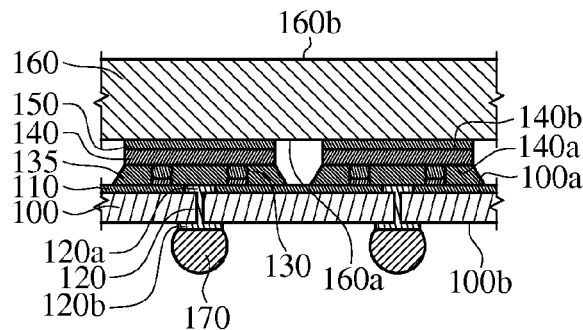
Figure 2G:
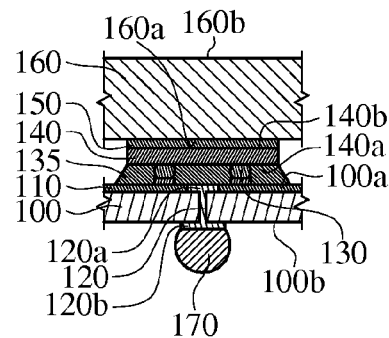
Figure 2H:
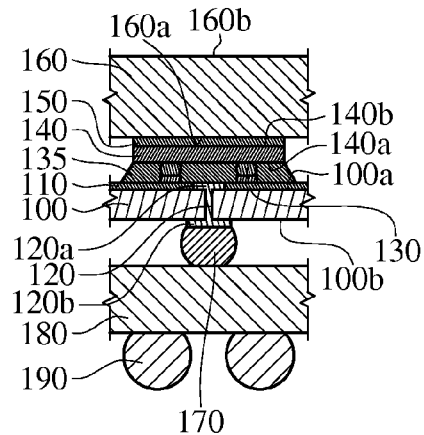

In addition, in another embodiment of the disclosure, the manufacturing process can further include the processes described in the following figures. As shown in FIG. 2F, at least one second bump 170 is disposed on the second surface 100b of the first substrate 100, and at least one of the second bumps 170 is electrically connected with the second terminal 120b of the TSV 120. As shown in the figure, the second bump 170 can be directly connected with the TSV 120. The previously disclosed re-distribution layers (RDL) can be also executed on the second surface 100b to redistribute the second bump 170, and part of the second bumps 170 are electrically connected with the TSV 120. Then as shown in FIG. 2G, the completed structure is diced and each diced part can have one or multiple first IC 140 and corresponding first heat-spreader cap 160. In addition, as shown in FIG. 2H, the second substrate 180 can be disposed on the second surface 100b of the first substrate, and the second substrate 180 is connected with the second bump 170. Then at least one third bump 190 (or solder ball) is disposed on the other side of the second substrate 180. After an appropriate circuit disposal of the second substrate 180, one of the third bumps 190 can be electrically connected with one of the second bumps 170.

Figure 3A:
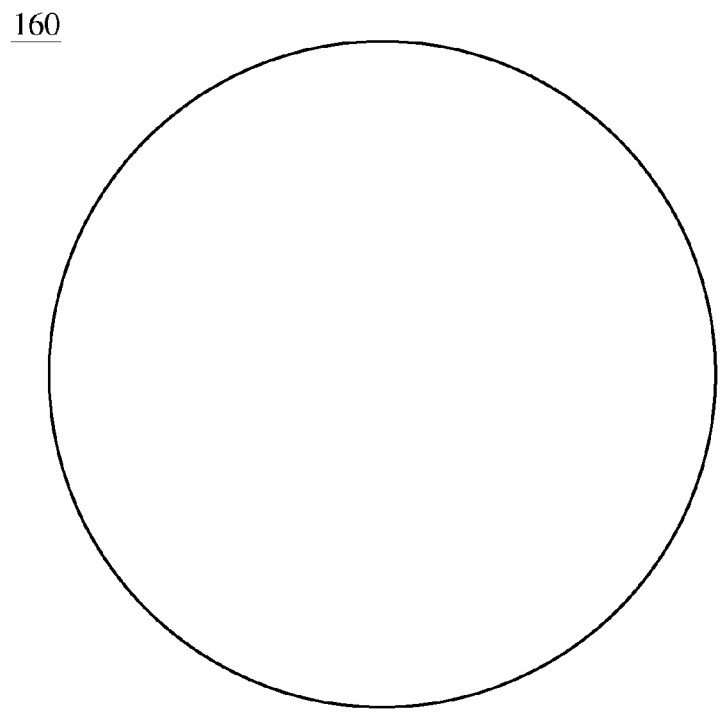
FIG. 3A is a top view of the heat-spreader cap without digging a groove according to an embodiment of the disclosure.
Figure 3B:
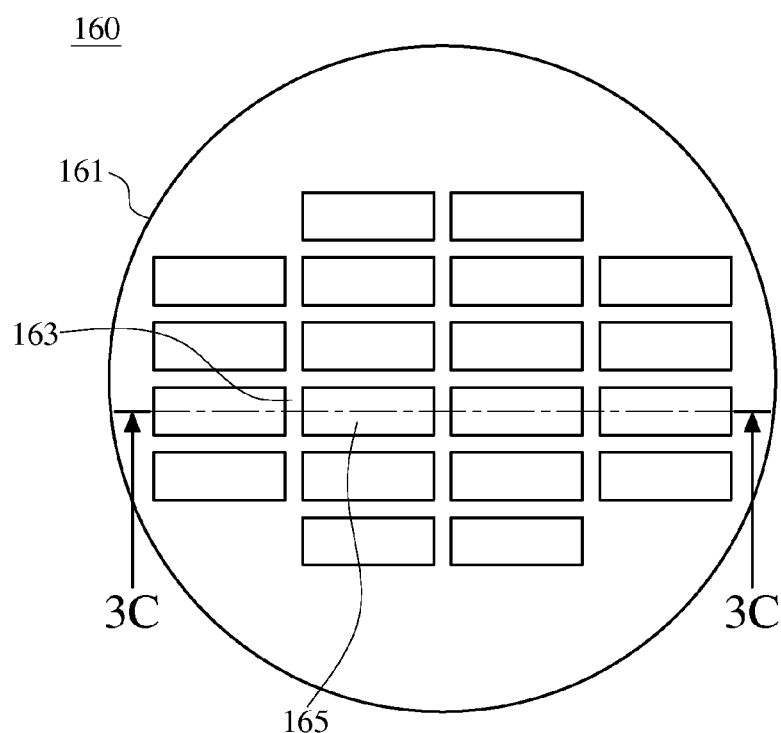
FIG. 3B is a top view of the heat-spreader cap without digging a groove according to an embodiment of the disclosure.
Figure 3C:
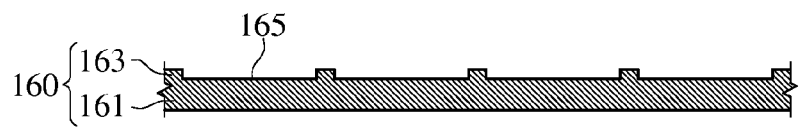
FIG. 3C is a cross-sectional diagram of FIG. 3B.

In an embodiment of the disclosure, the first heat-spreader cap 160 can be a slice (shown in FIG. 1). However, in other embodiments of the disclosure, the first heat-spreader cap 160 can be not a slice either. In association with the manufacturing process, please refer to FIG. 3A to FIG. 3C. FIG. 3A is a top view of the heat-spreader cap without digging a groove according to an embodiment of the disclosure. FIG. 3B is a top view of the heat-spreader cap without digging a groove according to an embodiment of the disclosure. FIG. 3C is a cross-sectional diagram of FIG. 3B. In an embodiment of the disclosure, as shown in FIG. 3A, because the first substrate 100 is a wafer, the first heat-spreader cap 160 can be made of a whole wafer or a slice of matter with the same size, and in the beginning, the groove is not dug on the whole wafer.

As shown in FIG. 3B and FIG. 3C, one or a plurality of grooves (or indentation or notch etc.) are dug in certain locations on the surface of the wafer. A hollow plane 165 located in the bottom (the lower surface 160a of the heat-spreader cap when the first heat-spreader cap 160 covers the first IC 140) of the groove and a supporter 163 surrounding the hollow plane are defined, so that when the first heat-spreader cap 160 covers the first substrate 100, the hollow plane 165 is attached on the first IC 140 by the TIM layer 150, and the supporter 163 is attached on the first substrate 100. The depth of the groove can to be designed appropriately, so that when the first heat-spreader cap 160 covers the first IC 140, the heat-spreader board 161 and the supporter 163 of the first heat-spreader cap 160 can be respectively attached on the first IC 140 (by the TIM layer 150) and the first substrate 100 (by the underfill 135). Therefore, when the first heat-spreader cap 160 is used as a carrier, the first heat-spreader cap 160 is attached on the first IC 140. Next, when the second surface 100b of the first substrate 100 is backgrinded, more connecting parts (of the heat-spreader board 161 and the supporter 163) can be used to share the lateral stress produced from backgrinding to avoid focusing all the lateral stress produced from backgrinding on the underfill 135 under the first IC 140 and on the TIM layer 150 over the first IC 140. Therefore, the yield rate is further enhanced accordingly.

Figure 4:
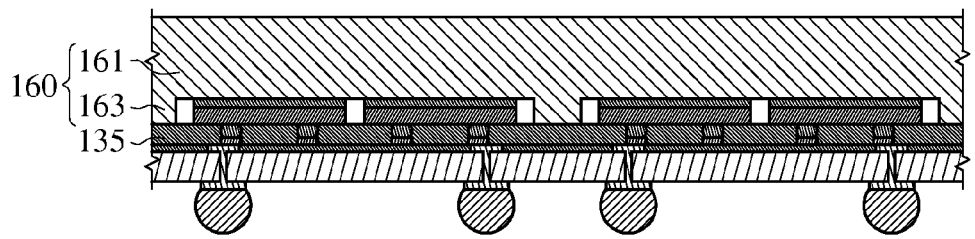
FIG. 4 is a cross-sectional diagram of the thinned integrated circuit device according to another embodiment of the disclosure.

Please refer to FIG. 4 for the thinned integrated circuit device made according to the said embodiment. FIG. 4 is a cross-sectional diagram of the thinned integrated circuit device according to another embodiment of the disclosure. Comparing the thinned integrated circuit device 10a of this embodiment with the thinned integrated circuit device 10 in FIG. 1, the difference is that first, the first heat-spreader cap 160 has two integrated parts: the heat-spreader board 161 and the supporter 163. The heat-spreader board 161 is attached on the second side 140b of the first IC 140 by the TIM layer 150. The supporter 163 is attached on the first surface 100a of the first substrate 100. In addition, in this embodiment, the underfill 135 is not only filled between the first IC 140 and the first substrate 100, but also filled between the supporter 163 and the first substrate 100. Besides, the underfill 135 is not filled in all the space between the first IC140 and the heat-spreader cap 160, so the supporter 163, the heat-spreader board 161, the underfill 135 on the first substrate 100, and the first IC 140 define a heat-spreader cavity surrounding the first IC 140. The heat-spreader cavity can be filled with air or materials with high thermal conductivity (such as the material of the TIM layer 150). In this embodiment, in order to adapt all kinds of temperature variations in the IC encapsulation and testing process, the material of the first heat-spreader cap 160 can be silicon or other silicon-based semiconductor materials, so that the thermal physics properties of the first heat-spreader cap 160 is close to, even the same with the first substrate 100 and the first IC 140. In an embodiment, in order to enhance the thermal conducting/dissipating ability, the material of the first heat-spreader cap 160 can be metal (such as copper or aluminum) or any other material with high thermal conductivity. The disclosure does not have any limitation.

Figure 5A:
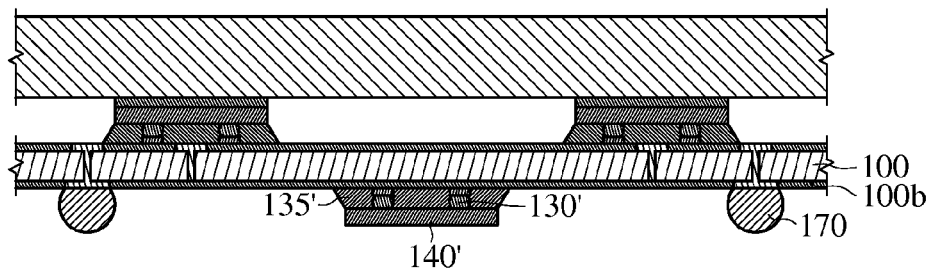
FIG. 5A is a cross-sectional diagram of the thinned integrated circuit device according to another embodiment of the disclosure.

In association with another embodiment of the disclosure, please refer to FIG. 5A. FIG. 5A is a cross-sectional diagram of the thinned integrated circuit device according to another embodiment of the disclosure. As the thinned integrated circuit device 10b shown in FIG. 5A, at least one third bump 130' and a second IC 140' are disposed on the second surface 100b of the first substrate 100. By circuit redistribution, the third bump 130' is electrically connected with part of the second bumps 170. The underfill 135' is filled between the second IC 140' and the second surface 100b of the first substrate 100 for fixing the second IC 140'. Because the size of the second bump 170 can be properly selected, so that the height of the second bump 170 is greater than the sum of the thickness of the second IC 140' and the height of the third bump 130' for utilizing the space effectively.

Figure 5B:
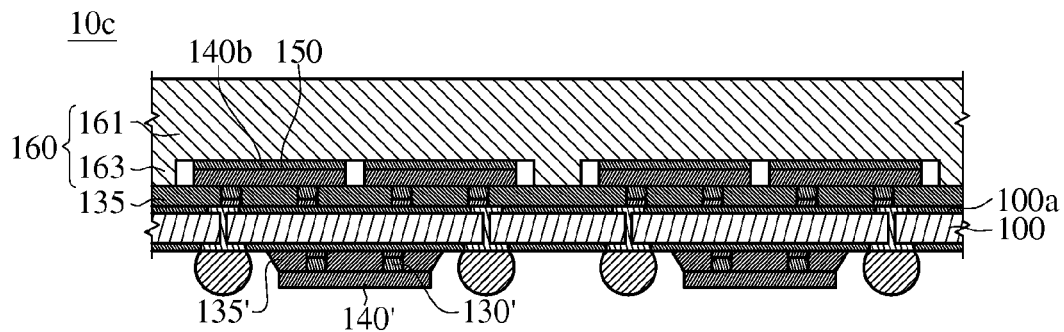
FIG. 5B is a cross-sectional diagram of the thinned integrated circuit device according to another embodiment of the disclosure.

In association with the thinned integrated circuit device disclosed by another embodiment of the disclosure, please refer to FIG. 5B. FIG. 5B is a cross-sectional diagram of the thinned integrated circuit device according to another embodiment of the disclosure. As the thinned integrated circuit device 10c shown in FIG. 5B, compared with the embodiment of FIG. 5A, the difference is that first the first heat-spreader cap 160 has two integrated parts: the heat-spreader board 161 and the supporter 163. The heat-spreader board 161 is used as a carrier and attached on the second side 140b of the first IC 140 by the TIM layer 150. The supporter 163 is attached on the first surface 100*a* of the first substrate 100. In this embodiment, the underfill 135 is not only disposed between the first IC 140 and the first substrate 100, but also disposed between the supporter 163 and the first substrate 100. In addition, the underfill 135 is not filled in all the space between the first IC 140 and the heat-spreader cap 160. Therefore, the supporter 163, the heat-spreader board 161, the underfill 135 on the first substrate 100, and the first IC 140 define a heat-spreader cavity surrounding the first IC 140.

Figure 6A:
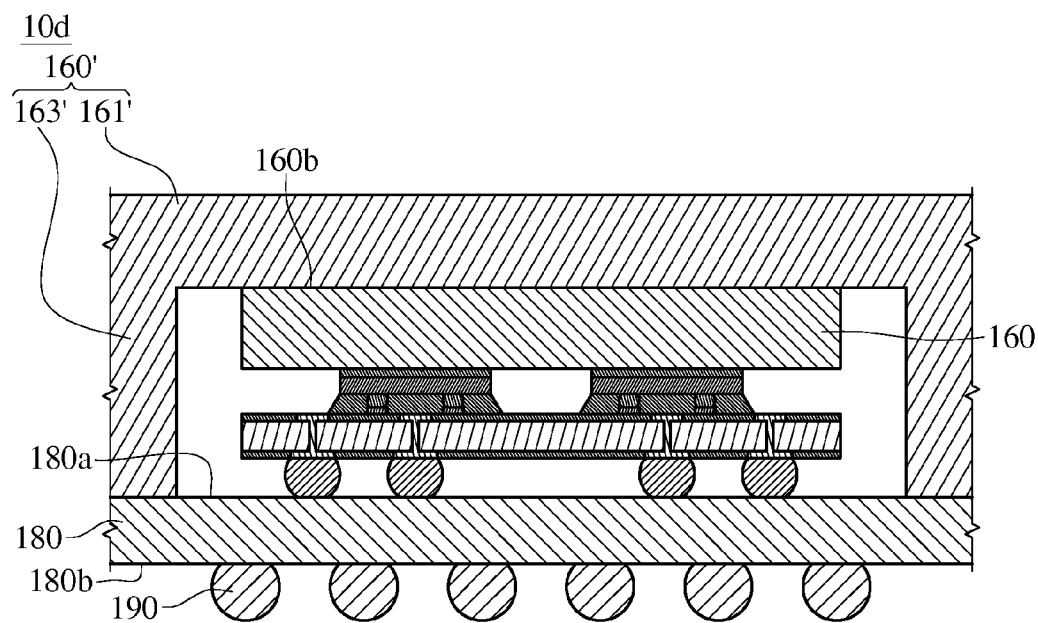
FIG. 6A is a cross-sectional diagram of the thinned integrated circuit device according to a further embodiment of the disclosure.
Figure 6B:
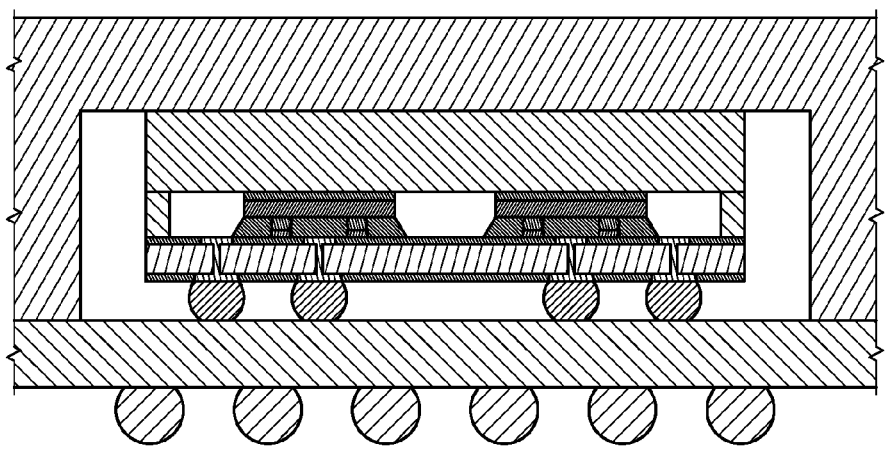
FIG. 6B is a cross-sectional diagram of the thinned integrated circuit device according to another embodiment of the disclosure.
Figure 7A:
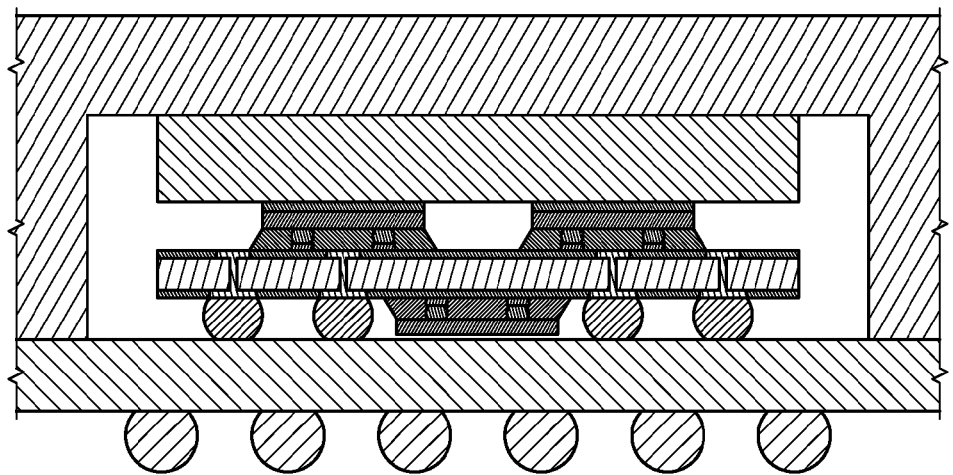
FIG. 7A is a cross-sectional diagram of the thinned integrated circuit device according to a further embodiment of the disclosure.
Figure 7B:
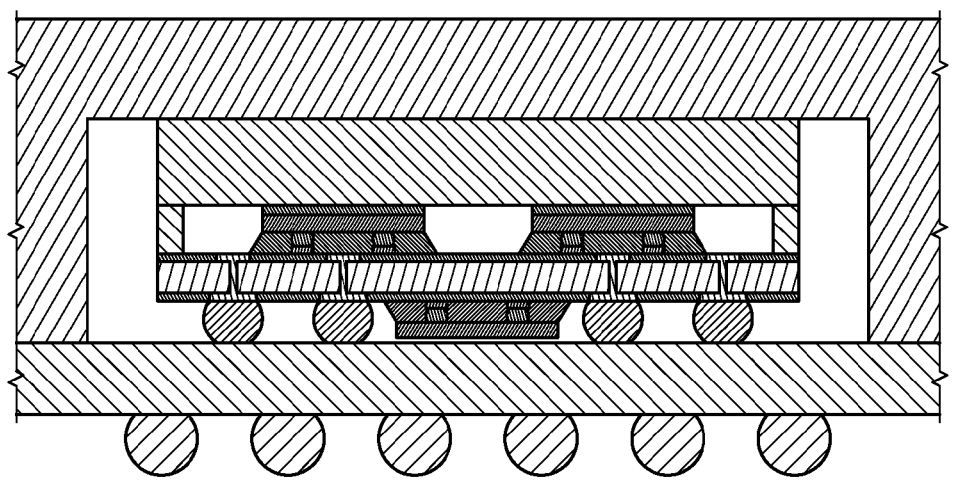
FIG. 7B is a cross-sectional diagram of the thinned integrated circuit device according to another embodiment of the disclosure.

In association with the thinned integrated circuit device disclosed by a further embodiment of the disclosure, please refer to FIG. 6A. FIG. 6A is a cross-sectional diagram of the thinned integrated circuit device according to a further embodiment of the disclosure. As shown in FIG. 6A, the thinned integrated circuit device 10*d*, compared with the thinned integrated circuit device 10 in FIG. 1, further has a second substrate 180, at least one third bump 190, and a second heat-spreader cap 160'. The second substrate 180 has a third surface 180*a* and a fourth surface 180*b* opposite to the third surface, and the third surface 180*a* is connected with the second bump 170. The third bump 190 is disposed on the fourth surface 180*b* of the second substrate 180, and the third bump 190 can be electrically connected with the second bump 170. The second heat-spreader cap 160' can be disposed on the upper surface 160*b* of the first heat-spreader cap 160. The second heat-spreader cap 160' can also have two integrated parts: the heat-spreader board 161' and the supporter 163'. The heat-spreader board 161' is attached on the upper surface 160*b* of the first heat-spreader cap 160. The supporter 163' can be attached on the third surface 180*a* of the second substrate 180 as shown in the figure, or be attached on the lateral of the second substrate 180. When the structural feature of the thinned integrated circuit device 10*a* shown in FIG. 4 is added into the thinned integrated circuit device 10*d* of FIG. 6A, then the thinned integrated circuit device 10*e* shown in FIG. 6B is obtained. In addition, when the structural features in FIG. 5A or FIG. 5B, the second IC 140', and related components are added into FIG. 6A or FIG. 6B, then the thinned integrated circuit device 10*f* shown in FIG. 7A and the thinned integrated circuit device 10*g* shown in FIG. 7B are obtained respectively.

Figure 8A:
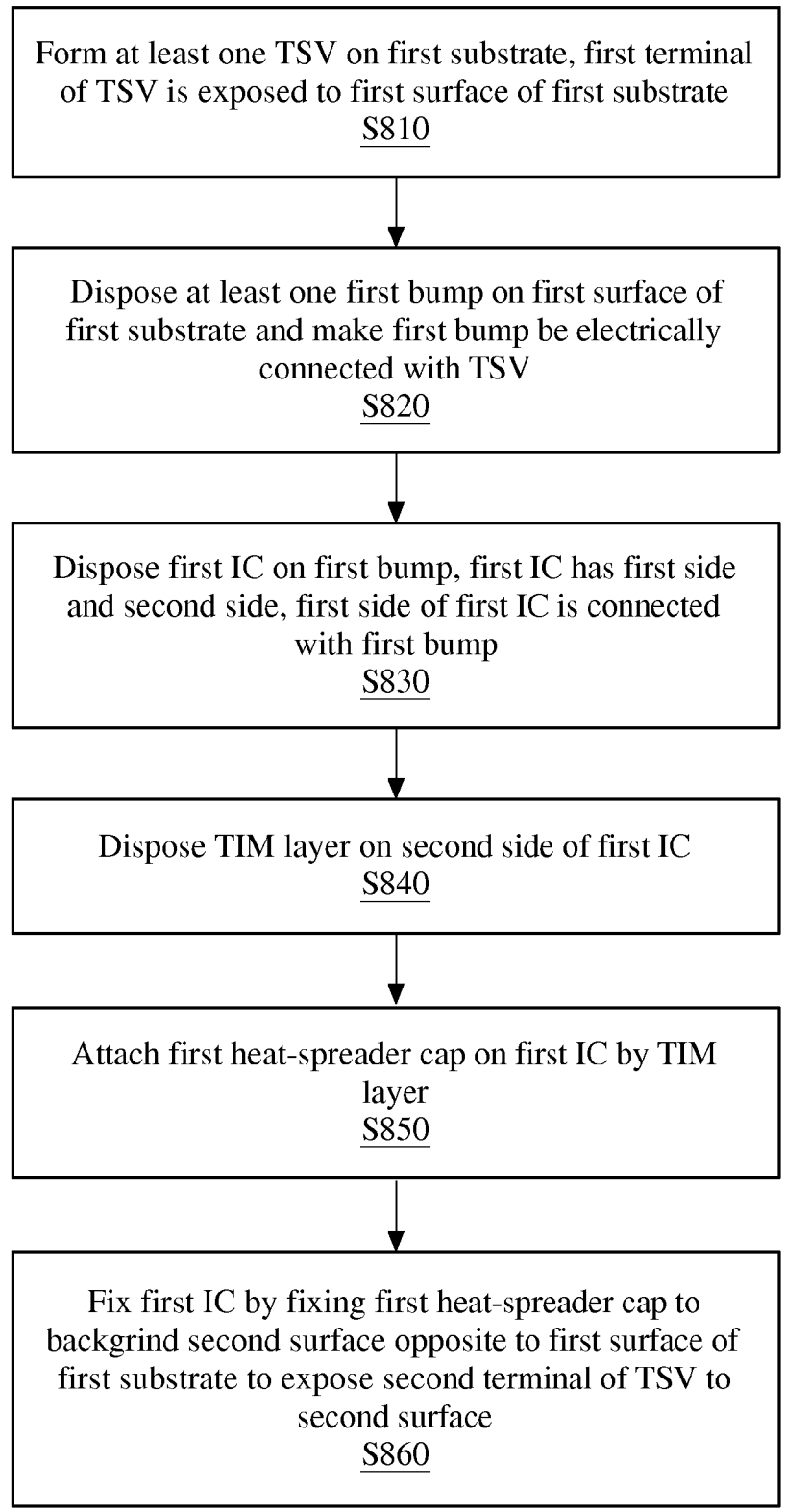
FIG. 8A is a flowchart of the manufacturing process of the thinned integrated circuit device according to an embodiment of the disclosure.

According to the said method and device, please refer to FIG. 8A for the manufacturing process of the thinned integrated circuit device disclosed in an embodiment of the disclosure. FIG. 8A is a flowchart of the manufacturing process of the thinned integrated circuit device according to an embodiment of the disclosure. As shown in the step S810, at least one TSV is formed on the first substrate, and the first terminal of the TSV is exposed to the first surface of the first substrate. As shown in the step S820, at least one first bump is disposed on the first surface of the first substrate and the first bump is electrically connected with the TSV. As shown in the step S830, a first IC is disposed on the bump, and the first IC has a first side and a second side, and the first side of the first IC is connected with the bump. As shown in the step S840, the TIM layer is disposed on the second side of the first IC. As shown in the step S850, the first heat-spreader cap is attached on the first IC by the TIM layer, and the first heat-spreader cap is used as a carrier. As shown in the step S860, the first IC is fixed by fixing the first heat-spreader cap to backgrind the second surface opposite to the first surface of the first substrate to expose the second terminal of the TSV to the second surface. Thereby, because the first heat-spreader cap can be used for cooling without being stripped off from the first IC, no more stripping process is needed and the probability of damaging the first IC or the thinned integrated circuit device is reduced, resulting in enhancing the yield rate of the thinned integrated circuit device.

Figure 8B:
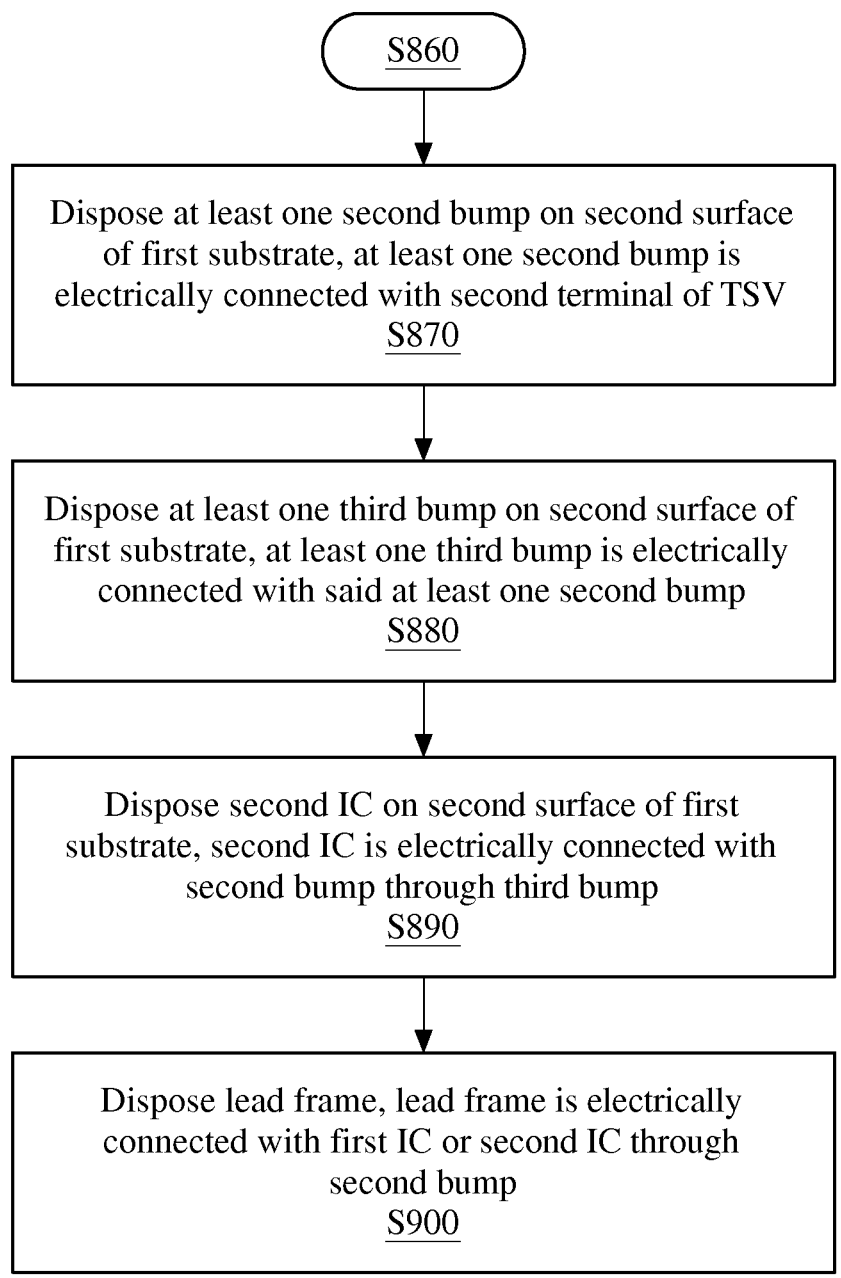
FIG. 8B is a flowchart of the manufacturing process of the thinned integrated circuit device following FIG. 8A according to an embodiment of the disclosure.

The manufacturing process of the thinned integrated circuit device disclosed in another embodiment of the disclosure can have extra processes. Please refer to FIG. 8B. FIG. 8B is a flowchart of the manufacturing process of the thinned integrated circuit device following FIG. 8A according to an embodiment of the disclosure. As shown in the step S870, at least one second bump is disposed on the second surface of the first substrate, wherein at least one second bump is electrically connected with the second terminal of the TSV. As shown in the step S880, at least one third bump is disposed on the second surface of the first substrate, wherein at least one third bump is electrically connected with the at least one second bump. As shown in the step S890, a second IC is disposed on the second surface of the first substrate, and the second IC is electrically connected with the second bump through the third bump. As shown in the step S900, a lead frame is disposed, and the lead frame is electrically connected with the first IC or second IC through the second bump. In other embodiments, the lead frame can be replaced by other device or component with the function of RDL. The disclosure does not have any limitation.

In summary, according to the manufacturing process of the thinned integrated circuit device disclosed by one or multiple embodiments of the disclosure, the heat-spreader cap/heat-spreader board is used as a carrying device or a carrier, and heat-spreader cap/heat-spreader board is fixed for backgrinding the substrate, so that an appropriate thickness of the substrate is obtained. In addition, because the heat-spreader cap/heat-spreader board can be directly used for the heat dissipation component in the IC encapsulation process, the heat-spreader cap/heat-spreader board does not need to be stripped from the IC. According to the process disclosed in the embodiments of the disclosure, the process of stripping the carrying device is absent compare to normal manufacturing process of the thinned integrated circuit device, so the possible damages of the IC in the known stripping process are not existed in the manufacturing process disclosed in the disclosure. The yield rate of the manufacturing process of the thinned integrated circuit device disclosed by multiple embodiments of the disclosure is significantly enhanced.

The foregoing description has been presented for purposes of illustration. It is not exhaustive and does not limit the invention to the precise forms or embodiments disclosed. Modifications and adaptations will be apparent to those skilled in the art from consideration of the specification and practice of the disclosed embodiments of the invention. It is intended, therefore, that the specification and examples be considered as exemplary only, with a true scope and spirit of the invention being indicated by the following claims and their full scope of equivalents.

What is claimed is:

1. A thinned integrated circuit device, comprising:
   a first substrate having a first surface and a second surface opposite to the first surface;
   at least one through-silicon via (TSV) penetrating through the first substrate from the first surface to the second surface, wherein a first terminal of the TSV is on the first surface and a second terminal of the TSV is on the second surface;
   at least one first bump disposed on the first surface and electrically connected with the first terminal of the TSV;
   a first integrated circuit (IC) having a first side and a second side, wherein the first side is connected with the first bump;

a thermal interface material (TIM) layer at least disposed on the second side of the first IC; and a first heat-spreader cap served as a carrier, attached on the first IC by the TIM layer, wherein the first heat-spreader cap comprises a heat-spreader board attached on the first IC by the TIM layer and at least one supporter integrated with the heat-spreader board and attached on the first surface of the first substrate.

2. The thinned integrated circuit device of claim 1, wherein the supporter surrounds the IC, and the supporter, the heat-spreader board, the first substrate, and the first IC defines a heat-spreader cavity surrounding the first IC.

3. The thinned integrated circuit device of claim 1, wherein the first heat-spreader cap has an upper surface and a lower surface, and the lower surface is attached on the IC by the TIM layer, and a roughness of the upper surface is lower than a threshold for fitting with an encapsulation cap or a set of heat-spreader fins.

4. The thinned integrated circuit device of claim 1, further comprising at least one second bump, disposed on the second surface of the first substrate, and electrically connected with the second terminal of the TSV.

5. The thinned integrated circuit device of claim 4, further comprising:
   at least one third bump disposed on the second surface of the first substrate and electrically connected with part of the second bump; and
   a second IC disposed on the second surface of the first substrate and electrically connected with the part of the second bump through the third bump.

6. The thinned integrated circuit device of claim 5, wherein a working power of the first IC is greater than a working power of the second IC.

7. The thinned integrated circuit device of claim 1, further comprising:
   a second substrate having a third surface and a fourth surface opposite to the third surface, and the third surface connected with the second bump; and
   at least one third bump disposed on the fourth surface of the second substrate and electrically connected with the second bump.

8. The thinned integrated circuit device of claim 7, wherein the first heat-spreader cap has an upper surface and a lower surface, and the lower surface is attached on the IC by the TIM layer, and the thinned integrated circuit device further comprises a second heat-spreader cap on the upper surface of the first heat-spreader cap.

9. The thinned integrated circuit device of claim 8, wherein the second heat-spreader cap comprises:
   a heat-spreader board attached on the upper surface of the first heat-spreader cap; and
   at least one supporter integrated with the heat-spreader board and attached on the second substrate.

10. A manufacturing process of the thinned integrated circuit device, comprising:
    forming at least one TSV on a first substrate, a first terminal of the TSV exposed to a first surface of the first substrate;
    disposing at least one first bump on the first surface of the first substrate and making the first bump be electrically connected with the TSV;
    disposing a first IC on the first bump, the first IC having a first side and a second side, the first side of the first IC being connected with the first bump;
    disposing a TIM layer on the second side of the first IC;
    attaching a lower surface of a first heat-spreader cap on the first IC by the TIM layer, wherein a shape and size of the first heat-spreader cap is the same with the first substrate;
    fixing the first heat-spreader cap to backgrind a second surface opposite to the first surface of the first substrate to expose a second terminal of the TSV to the second surface; and
    backgrinding an upper surface opposite to the lower surface of the first heat-spreader cap so that a roughness of the upper surface is lower than a threshold for fitting with an encapsulation cap or a set of heat-spreader fins.

11. The manufacturing process of the thinned integrated circuit device of claim 10, wherein prior to the step of attaching the first heat-spreader cap on the first IC by the TIM layer, further comprises:
    forming at least one groove on a lower surface of the first heat-spreader cap to define a hollow plane in a bottom of the groove and a supporter surrounding the hollow plane, so that when the first heat-spreader cap covers the first substrate, the hollow plane is attached on the first IC by the TIM layer and the supporter is attached on the first substrate.

12. The manufacturing process of the thinned integrated circuit device of claim 10, further comprising:
    disposing at least one second bump on the second surface of the first substrate, wherein at least one the second bump is electrically connected with the second terminal of the TSV.

13. The manufacturing process of the thinned integrated circuit device of claim 12, further comprising:
    disposing at least one third bump on the second surface of the first substrate, wherein the third bump is electrically connected with part of the second bumps; and
    disposing a second IC on the second surface of the first substrate, wherein the second IC is electrically connected with part of the second bumps through the third bump.

14. The manufacturing process of the thinned integrated circuit device of claim 13, wherein a working power of the first IC is greater than a working power of the second IC.

15. The manufacturing process of the thinned integrated circuit device of claim 10, further comprising:
    disposing a second substrate on the second surface of the first substrate, wherein the second substrate has a third surface and a fourth surface opposite to the third surface, and the third surface is connected with the second bump;
    disposing at least one third bump on the fourth surface of the second substrate; and
    disposing at least one conductive path on the second substrate for making the third bump be electrically connected with the second bump.

16. The manufacturing process of the thinned integrated circuit device of claim 15, further comprising disposing a second heat-spreader cap on a upper surface opposite to the lower surface of the first heat-spreader cap.

17. A thinned integrated circuit device, comprising:
    a first substrate having a first surface and a second surface opposite to the first surface;
    at least one through-silicon via (TSV) penetrating through the first substrate from the first surface to the second surface, wherein a first terminal of the TSV is on the first surface and a second terminal of the TSV is on the second surface;
    at least one first bump disposed on the first surface and electrically connected with the first terminal of the TSV;

at least one second bump disposed on the second surface and electrically connected with the second terminal of the TSV;

at least one third bump disposed on the second surface and electrically connected with part of the at least one second bump;

a first integrated circuit (IC) having a first side and a second side, wherein the first side is connected with the at least one first bump;

a second IC disposed on the second surface and electrically connected with the part of the at least one second bump through the at least one third bump;

a thermal interface material (TIM) layer at least disposed on the second side of the first IC; and a first heat-spreader cap served as a carrier, attached on the first IC by the TIM layer.

18. The thinned integrated circuit device of claim 17, wherein a working power of the first IC is greater than a working power of the second IC.

* * * * *